United States Patent
Wilson (10) Patent No.: US 9,774,306 B2
(45) Date of Patent: *Sep. 26, 2017

(54) POWER AMPLIFIER WITH STABILISING NETWORK

(71) Applicant: SnapTrack, Inc., San Diego, CA (US)

(72) Inventor: Martin Paul Wilson, Cambourne (GB)

(73) Assignee: SnapTrack, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/082,968

(22) Filed: Nov. 18, 2013

(65) Prior Publication Data

US 2014/0077881 A1    Mar. 20, 2014

Related U.S. Application Data (63) Continuation of application No. 13/361,421, filed on Jan. 30, 2012, now Pat. No. 8,587,379, which is a (Continued)

(30) Foreign Application Priority Data

Feb. 11, 2004    (GB) .................................. 0403021.9

(51) Int. Cl.
    *H03F 1/30*    (2006.01)
    *H03F 3/193*    (2006.01)
    (Continued)

(52) U.S. Cl.
    CPC ............. *H03F 3/193* (2013.01); *H03F 1/02* (2013.01); *H03F 1/0222* (2013.01); *H03F 1/086* (2013.01);
    (Continued)

(58) Field of Classification Search
    CPC ........................................................ H03F 1/30
    (Continued)

(56) References Cited

U.S. PATENT DOCUMENTS 4,065,723 A * 12/1977 Endres .................... H03F 3/245
    330/278
4,685,041 A * 8/1987 Bowman ................. H02M 3/28
    363/126

(Continued)

FOREIGN PATENT DOCUMENTS

| EP | 1137171 A1 | 9/2001 |
|---|---|---|
| GB | 2058501 A | 4/1981 |

(Continued)

OTHER PUBLICATIONS

"USPTO Office Action for U.S. Appl. No. 10/597,944 dated Oct. 10, 2008", Oct. 10, 2008, Publisher: United States Patent and Trademark Office, Published in: USA.

(Continued)

*Primary Examiner* — Henry Choe
(74) *Attorney, Agent, or Firm* — Patterson & Sheridan, L.L.P.

(57) ABSTRACT

A power amplifier circuit comprising a transistor for receiving a signal to be amplified at an input and for outputting an amplified signal at an output; a modulated power supply connected to the transistor output; and a resistive element connected at the transistor output such that a low impedance is maintained at the transistor output across a range of operational frequencies.

13 Claims, 5 Drawing Sheets

Related U.S. Application Data continuation of application No. 12/985,938, filed on Jan. 6, 2011, now Pat. No. 8,106,713, which is a continuation of application No. 10/597,944, filed as application No. PCT/IB2005/000338 on Feb. 9, 2005, now Pat. No. 7,868,698.

(51) Int. Cl.

| | | |
|---|---|---|
| *H03F 1/02* | (2006.01) | |
| *H03F 1/08* | (2006.01) | |
| *H03F 1/32* | (2006.01) | |
| *H03F 1/56* | (2006.01) | |
| *H03F 3/19* | (2006.01) | |
| *H03F 3/191* | (2006.01) | |
| *H03F 3/21* | (2006.01) | |

(52) U.S. Cl.
CPC ............... *H03F 1/32* (2013.01); *H03F 1/565* (2013.01); *H03F 3/19* (2013.01); *H03F 3/191* (2013.01); *H03F 3/21* (2013.01); *H03F 2200/391* (2013.01); *Y10T 29/49002* (2015.01)

(58) Field of Classification Search
USPC ................................ 330/297, 302, 285, 296
See application file for complete search history.

(56) References Cited

U.S. PATENT DOCUMENTS

| | | | | |
|---|---|---|---|---|
| 4,835,485 A * | 5/1989 | Mueller | ................. | H03F 3/193 330/277 |
| 5,023,569 A * | 6/1991 | Raven | ................. | H03G 1/0082 330/285 |
| 5,239,275 A | 8/1993 | Leitch | | |
| 5,272,450 A | 12/1993 | Wisherd | | |
| 5,406,224 A * | 4/1995 | Mikami | ................. | H03F 1/086 330/277 |
| 5,406,226 A * | 4/1995 | Cioffi | ................. | H03F 1/34 330/286 |
| 5,708,573 A * | 1/1998 | Lusher | ................. | H02M 3/155 323/222 |
| 5,748,042 A * | 5/1998 | Norris | ................. | H03F 1/3205 330/149 |
| 5,760,650 A | 6/1998 | Faulkner et al. | | |
| 5,914,641 A * | 6/1999 | Yun | ................. | H03F 1/0272 330/285 |
| 6,023,197 A | 2/2000 | Ter Laak et al. | | |
| 6,052,033 A | 4/2000 | Schneider | | |
| 6,137,358 A | 10/2000 | Midya et al. | | |
| 6,441,689 B1 * | 8/2002 | Joseph | ................. | H03F 3/191 330/294 |
| 6,888,409 B1 * | 5/2005 | Taylor | ................. | H03F 3/189 330/285 |
| 6,963,247 B2 | 11/2005 | Sivonen et al. | | |
| 7,078,976 B2 * | 7/2006 | Blednov | ................. | H01L 24/49 330/124 R |
| 7,102,429 B2 * | 9/2006 | Stengel | ................. | H03F 1/0266 330/10 |
| 7,161,434 B2 * | 1/2007 | Rhodes | ................. | H03F 3/217 330/302 |
| 7,202,734 B1 * | 4/2007 | Raab | ................. | H03F 3/04 330/126 |
| 7,245,186 B2 * | 7/2007 | Chang | ................. | H03F 3/191 327/552 |
| 7,372,334 B2 * | 5/2008 | Blair | ................. | H01L 23/66 330/302 |
| 7,868,698 B2 * | 1/2011 | Wilson | ................. | 330/302 |
| 8,106,713 B2 * | 1/2012 | Wilson | ................. | 330/297 |
| 8,587,379 B2 * | 11/2013 | Wilson | ................. | 330/297 |
| 2003/0006836 A1 | 1/2003 | Pellat et al. | | |
| 2003/0176174 A1 | 9/2003 | Seppinen et al. | | |
| 2004/0198271 A1 * | 10/2004 | Kang | ................. | H03F 1/086 455/127.1 |
| 2014/0077881 A1 | 3/2014 | Wilson | | |

FOREIGN PATENT DOCUMENTS

| | | |
|---|---|---|
| GB | 2058501 A | 4/1981 |
| GB | 2058507 A | 4/1981 |
| WO | 03012982 A2 | 2/2003 |

OTHER PUBLICATIONS

"USPTO Office Action for U.S. Appl. No. 10/597,944 dated Apr. 21, 2009", Apr. 21, 2009, Publisher: United States Patent and Trademark Office, Published in: USA.

"USPTO Office Action for U.S. Appl. No. 10/597,944 dated Oct. 30, 2009", Oct. 30, 2009, Publisher: United States Patent and Trademark Office, Published in: USA.

"USPTO Office Action for U.S. Appl. No. 10/597,944 dated May 13, 2010", May 13, 2010, Publisher: United States Patent and Trademark Office, Published in: USA.

"Related U.S. Appl. No. 12/985,938 Office Action", Feb. 23, 2011, Publisher: USPTO, Published in: US.

JPO, "International Application No. JP2011-184960 Office Action", Oct. 12, 2012, Publisher: JPO, Published in: JP.

"Related U.S. Appl. No. 13/361,421 Office Action", Feb. 5, 2013, Publisher: USPTO, Published in: US.

"British Search Report for British International Application No. GB 0403021.9", May 18, 2005, Publisher: British Patent Office, Published in: GB.

International Preliminary Examining Authority, "International Preliminary Report on Patentability for International Application No. PCT/IB2005/000338", Mar. 1, 2006, Publisher: European Patent Office—PCT, Published in: EP.

Staudinger et al., "Enhanced Filtering Method for Envelope Elimination and Restoration Amplification", "XP-000883908", Jan. 1999, pp. 247-248, vol. 37, Publisher: Motorola Technical Developments, Motorola Inc., Published in: Illiniois, US.

* cited by examiner

POWER AMPLIFIER WITH STABILISING NETWORK

CROSS REFERENCE TO RELATED APPLICATIONS

This application is a continuation of U.S. patent application Ser. No. 13/361,421, with a U.S. filing date of Jan. 30, 2012, which is a continuation U.S. patent application Ser. No. 12/985,938, with a U.S. filing date of Jan. 6, 2011, now U.S. Pat. No. 8,106,713, which is a continuation of U.S. application Ser. No. 10/597,944, with a U.S. filing date of May 8, 2007, now U.S. Pat. No. 7,868,698, is a 371 filing of PCT/IB2005/000338, filed on Feb. 9, 2005 which claims priority of British Application Number GB 0403021.9, filed on Feb. 11, 2004.

Furthermore, U.S. Ser. No. 13/361,421 and GB 0403021.9 are incorporated herein by reference.

FIELD OF THE INVENTION

The present invention relates to power amplifiers, and in particular a power amplifier provided with a modulatable power supply.

BACKGROUND TO THE INVENTION

A known technique for providing an efficient means of power amplifying a non-constant envelope signal is to use envelope modulation. Envelope modulation is typically provided by means of a highly efficient modulatable power supply.

However, in such an arrangement the power amplifier presents an impedance to the modulatable supply. In particular, this impedance can change rapidly with frequency due to a presence of a high Q series resonance, making accurate high bandwidth modulation very difficult. In a typical transistor output stage, the transistor device capacitance resonates with the inductance of the supply feed to form such a series resonance. This series resonance presents problems if the supply modulation is to be applied at high bandwidths.

One solution is to redesign the power output stage to move the resonance to a higher frequency. However it is difficult to achieve this without compromising the output stage with respect to some other parameter. For example reducing the capacitance can only be achieved by changing the output device technology from, for example, LDMOS to GaAs mesfet or Phemt. This could potentially have a major implication on the cost of such units, as well as the ability to manufacture such units. Reducing the inductance of the supply feed, as an alternative, would affect the load presented to the transistor at RF and its harmonics. This could compromise the RF stage efficiency, gain or bandwidth.

Thus a problem exists with current power amplifier output stages in that at high frequencies a series resonance is presented at the power supply terminal of the amplifier as a consequence of the output capacitance of the transistor forming a high Q resonant network with the supply feed inductance. This network creates a source of potential instability, and creates a long time constant energy storage means that contributes to memory effect, and renders any form of wideband envelope modulation difficult to apply.

It is an aim of the present invention to provide an improved technique which addresses one or more of the above stated problems.

SUMMARY OF THE INVENTION

In accordance with the invention there is provided a power amplifier including a resistive element connected at an output thereof to maintain a low impedance at the output across a range of operational frequencies.

The power amplifier may further include a transistor for receiving a signal to be amplified at an input and for providing an amplified signal at the output.

The output may be adapted for connection to a modulated power supply. The output may be adapted for connection to a modulated power supply via a supply feed inductance.

Said resistive element may comprise a resistor.

A reactive element may be connected in series with said resistive element. The resonant element may comprise a capacitive element or an inductive element in series with a capacitive element. Said inductive element may comprise a conductive element of said circuit. The conductive element may comprise a part of a conductive track or a bond wire. Said inductive element may comprise an inductor. Said capacitive element may comprise a capacitor.

The signal to be amplified may be a radio frequency signal.

In a further aspect the invention provides a power amplifier circuit comprising a transistor for receiving a signal to be amplified at an input and for outputting an amplified signal at an output; a modulated power supply connected to the transistor output; and a resistive element connected at the transistor output such that a low impedance is maintained at the transistor output across a range of operational frequencies.

The invention still further provides a method of maintaining a low impedance across a range of operational frequencies in a power amplifier, the method including providing a resistive element at an output of the power amplifier.

The method may further comprise step of providing a reactive element connected in series with said resistive element.

A series resonance at the power supply is equivalent to a parallel resistance at the junction between the inductance and the capacitance. This junction is the drain of the transistor. The low impedance at the power supply terminal is equivalent to a high impedance at the transistor terminal. This provides a solution of presenting a low impedance to the transistor terminal to thereby damp out the series resonance appearing at the power supply terminal.

BRIEF DESCRIPTION OF THE FIGURES

The invention is now described with reference to particular embodiments as illustrated by the accompanying figures, in which:

FIGS. 3(*a*) to 3(*c*) illustrate curves of impedance, phase, and amplitude respectively for various frequencies, exhibited by the resonance at the transistor terminal with and without a control circuit in accordance with embodiments of the invention;

FIGS. 4(*a*) and 4(*b*) illustrate the electrical equivalent circuit of a power amplifier such as shown in FIG. 1, including the implementation of a control circuit in accordance with embodiments of the invention.

DESCRIPTION OF THE PREFERRED EMBODIMENTS

Figure 1:
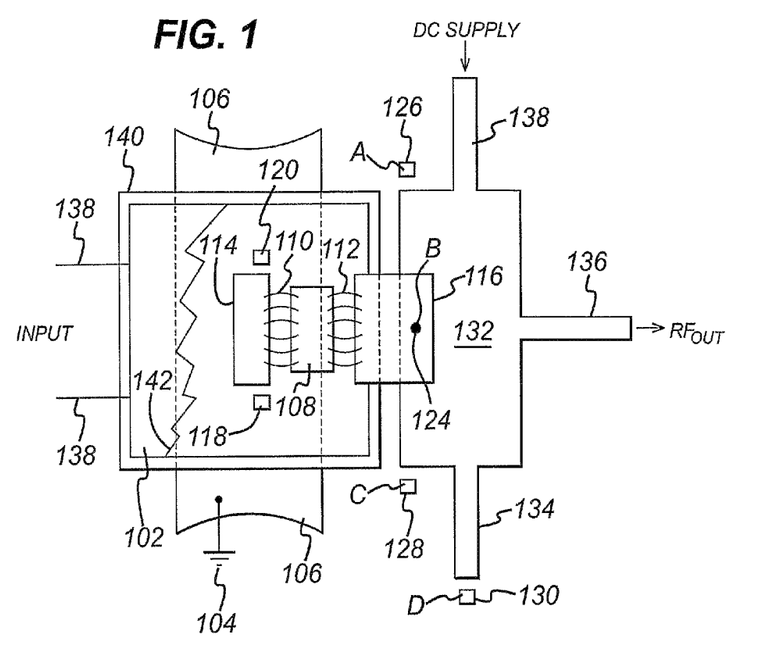
FIG. 1 illustrates a physical representation of a RF power stage, including example locations of a control circuit implemented in accordance with embodiments of the invention.

With reference to FIG. 1, an example physical representation of a RF power stage with which embodiments of the invention is implemented is illustrated.

With reference to FIG. 1, reference numeral 140 generally represents a transistor package. Reference numeral 102 generally represents the top surface of the transistor package. The jagged line 142 represents the opening of the top surface of the transistor package to show at least part of the internal structure thereof. The internal structure of the transistor package includes an array of transistor power amplifiers 114 and a corresponding array or bank of matching capacitors 108. The plurality of transistor power amplifiers 114 are connected to the corresponding plurality of capacitors 108 via a plurality of bond wires 110. The plurality of capacitors 108 are connected, via a further plurality of bond wires 112, to a metallisation 116 which represents the connection of the bond wires 112 external to the transistor package 140. The transistor package additionally is provided with a metallisation 106 which is connected to ground, as represented by reference numeral 104. A plurality of inputs are provided to the transistor package, forming the inputs for the plurality of transistor power amplifiers 114. The plurality of inputs are generally represented by reference numerals 138.

As the invention is concerned with the output of the transistor amplifiers, as further described hereinbelow, the input stages of the transistor package 140 are not shown in any detail in FIG. 1.

As further illustrated in FIG. 1, there is provided a metallisation pattern 132 on a printed wiring board or printed circuit board on which the transistor package 140 is mounted. The metallisation 116 connected to the bond wires 112 connect to the metallisation layer 132 on the printed wiring or circuit board.

The metallisation 132 is configured to have a bias feed strip 138 to which a DC supply voltage is supplied, a transistor drain strip 134, and an output strip 136 at which the radio frequency output signal $RF_{OUT}$ is provided.

The DC feed 138 provides a defined load for the RF transistor and the RF frequency and harmonics thereof. Ideally, this load would be a short at baseband frequencies. However in order to provide a satisfactory load at the radio frequency and harmonics thereof, the baseband impedance is required to be significant.

In order to provide an acceptable match to the low internal load impedance of the output of the transistor, an internal match network is typically provided internal to the transistor. This is best illustrated by an equivalent circuit of the power amplifier circuit, as represented in FIG. 2.

Figure 2:
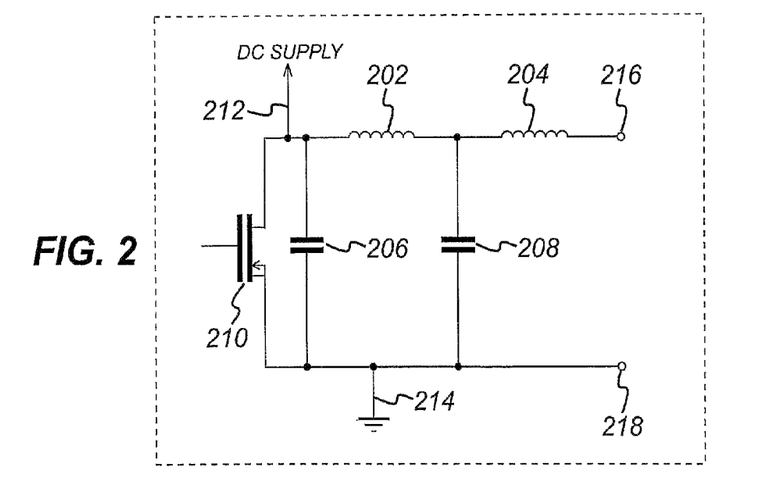
FIG. 2 illustrates the equivalent circuit of a packaged power transistor such as shown in FIG. 1.

FIG. 2 shows a typical equivalent circuit of the output of a power amplifier circuit including the elements internal to the transistor package 102.

As represented in FIG. 2, the equivalent circuit includes a transistor 210. A capacitor 206 is connected in parallel across the source and drain of the transistor. The capacitor 206 represents the internal parasitic capacitance to the bulk of the transistor 210. The output of the transistor 210, namely the transistor drain, is taken on line 212 and connected to the DC power supply. It should be noted that the DC supply is connected to the output of the transistor via a supply feed inductance (not shown in FIGS. 1 and 2). A series inductance, represented by inductor 202, is connected to the drain of the transistor 210. This inductor 202 is representative of the inductance of the bond wire 110 connecting the output of the transistor power amplifier to a capacitor of the capacitor bank 108. A capacitor 208 is connected in parallel across the inductor 202 and the source of the transistor 210. The capacitor 208 represents one of the capacitors of the capacitor bank 108. A further inductor 204 is connected in series with the inductor 202. The inductor 204 represents the inductance of the bond wire 112 connecting the capacitor 208 to the metallisation 116. The source of the transistor 210 is connected to ground, represented by reference numeral 214. In FIG. 2, the terminal 216 represents the connection to the metallisation 116, and the terminal 218 represents a ground connection.

In transistor power amplifier implementations, the capacitor bank 108 may not always be provided. The capacitor bank 108 provides an impedance transformation capacitor for each transistor power amplifier. Where the capacitor bank 108 is not provided, use of the invention, as further described hereinbelow, is still advantageous, because there is still substantial capacitance associated with the transistor structure, as represented by capacitor 206 in FIG. 2.

As can be seen from FIG. 2, the equivalent circuit of the transistor package provides a resonant circuit. The resonant circuit has contributions to capacitance from the bulk capacitance 206 and the matching capacitor 208 from the capacitor bank 108. The inductance includes inductors 202 and 204 representing the inductance of the bond wires 110 and 112, as well as the supply feed inductance. In addition, the inductance is further contributed to by the transistor drain strip 132 and the bias feed 138. This inductance all appears across the supply in series with the capacitors 206 and 208. This parasitic resonant circuit results in parasitic resonance at high impedance, when a high impedance is presented at the transistor output.

The structure of the power amplifier circuitry provides a series resonant network at the power supply terminal, leading to the presentation of a very low impedance load to the power supply at high frequencies. This low impedance presented to the power supply transforms into a high impedance presented to the transistor drain. The resonance is undesired. In order to provide damping to this undesired resonance, a low resistance can be provided to the drain of the transistor for the same range of frequencies that the bias network presents a high impedance. However, this must be achieved without loading the output of the transistor at radio frequencies. If envelope modulation is to be applied, the network must also not provide significant loading at the modulation frequency.

The inventive solution is to provide a resistor in series with the DC feed to reduce the Q of the resonance. This is an effective solution, but a resistor set at a value that significantly reduces the resonance may consume an unexpectedly large portion of the power fed to the amplifier.

The invention thus provides a solution by providing a second resonant network, which may be considered to be a resonance compensation network or circuit or a control network or circuit, that connects to the output of the transistor. As the impedance of the transistor output terminal rises due to the bias resonance, the control resonant network impedance lowers.

The problem to which the invention is addressed, and the solution provided by the invention, is further discussed with reference to FIGS. 3(a) to 3(c), before further describing the implementation of the solution with regards to FIGS. 4(a) and 4(b) and FIG. 5.

Figure 3A:
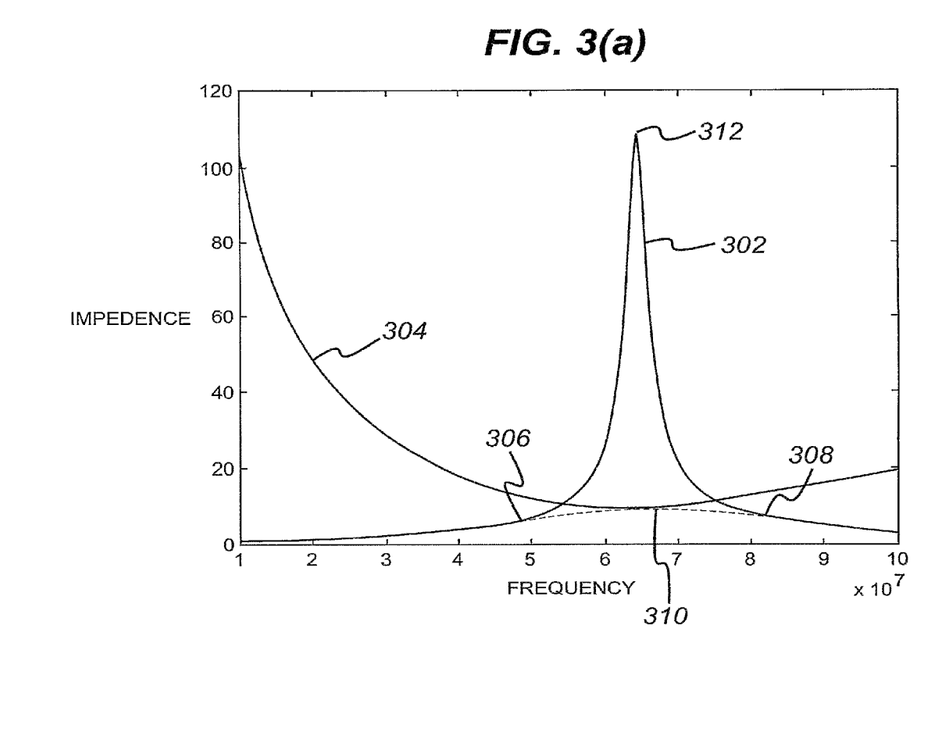

FIG. 3(a) illustrates a plot of impedance against frequency for a transistor power amplifier with a modulatable supply. Reference numeral 302 designates the plot of impedance against frequency of such an amplifier output stage without any compensation in accordance with the invention. As can be seen, a spike 312 occurs at a particular range of frequencies, causing a significantly increased impedance at such frequencies. The impedance characteristics provided by the compensation circuit, the structure of which is further described hereinbelow, is represented by the curve 304. As can be seen, the curve 304 represents a significantly lower impedance at the range of frequencies at which an impedance problem occurs. As a result, the overall effect of the control circuit is such that at the range of frequencies where the impedance ordinarily is significantly increased, the impedance is reduced. As illustrated in FIG. 3(a), the effect of the control circuit between points 306 and 308 on the curve 302 is denoted by the dash line 310, and it can be seen that the impedance is substantially reduced.

Figure 3B:
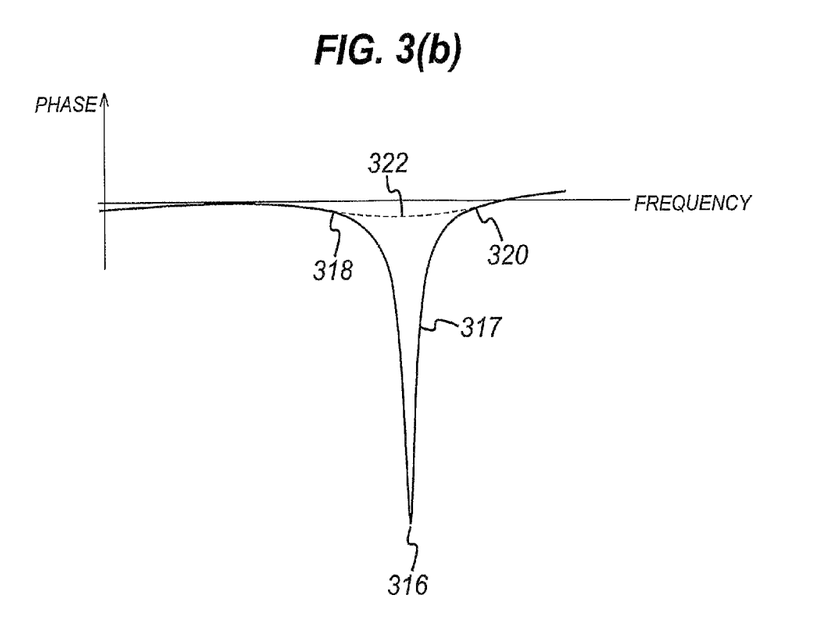
Figure 3C:
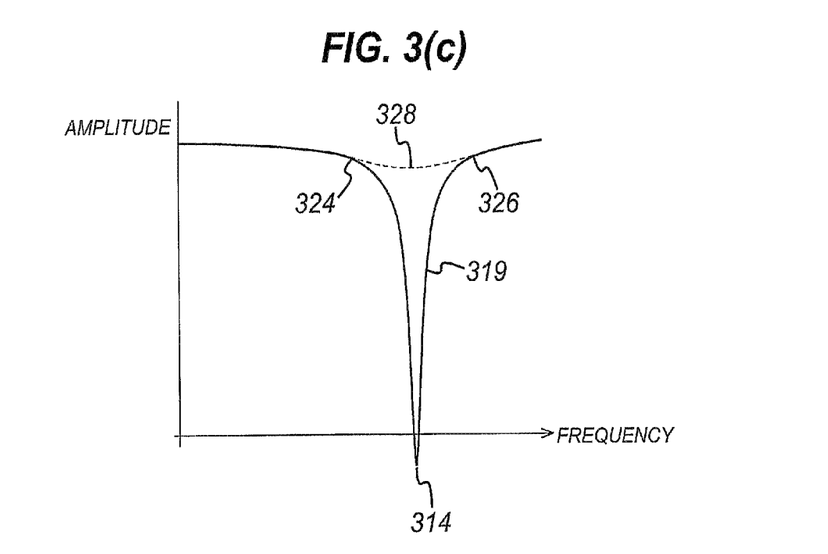

With reference to FIG. 3(b), there is illustrated a plot of phase against frequency for the transistor output amplifier. As can be seen, the plot 317 has a significant negative peak denoted by reference numeral 316. By provision of the control circuit of the present invention, this peak is removed and the curve has a much reduced distortion between points 318 and 320 as represented by dash line 322. Similarly in FIG. 3(c) there is illustrated a plot of amplitude against frequency. As can be seen the output amplitude dips significantly to a negative peak at point 314. The curve of amplitude against frequency 319 is controlled by the control circuit of the invention between points 324 and 326 such that the negative peak is significantly reduced, as represented by the dash line 328.

The invention, and the example implementation thereof, is now further illustrated with reference to FIGS. 4(a) and 4(b). In FIG. 4(a), a transistor power amplifier is represented by reference numeral 402. A capacitor 406, representing a matching capacitance, is connected in parallel across the source and drain of the transistor 402. Resistor 404 represents a load which the power amplifier is driving. Further represented in FIG. 4(a) are four inductors, denoted 412, 410, 408, and 407. The inductor 407 represents the inductance associated with the supply strip 138, the inductor 408 represents the inductance associated with the metallisation 132 between the connection point to the metallisation and the supply strip, the inductor 410 represents the inductance of the metallisation between the connection point to the metallisation and the drain strip 134, and the inductor 412 represents the inductance of the drain strip 134. The points A, B, C, D are marked in FIG. 4(a) and in FIG. 1, and the inductors 412, 410, 408, 407 represent the inductances between such points, which are provided by metallisation.

The invention, in embodiments, is to provide a resonant circuit at the output of the transistor power amplifier. Such a resonant circuit is illustrated in FIG. 4(b). The resonant circuit 426 comprises, in series, an inductor 420, a capacitor 422, and a resistor 424. The resonant circuit 426 is connected between terminals 428 and 430, and terminal 430 is connected to ground as represented by reference numeral 432. The provision of the resistor 424 allows the power problem as described hereinabove to be avoided. The resonant circuit provided by the inductor 420 and the capacitor 422 are not required in order to overcome the power problem, but are preferably provided so as to ensure that the resistor 424 does not consume power.

Figure 4A:
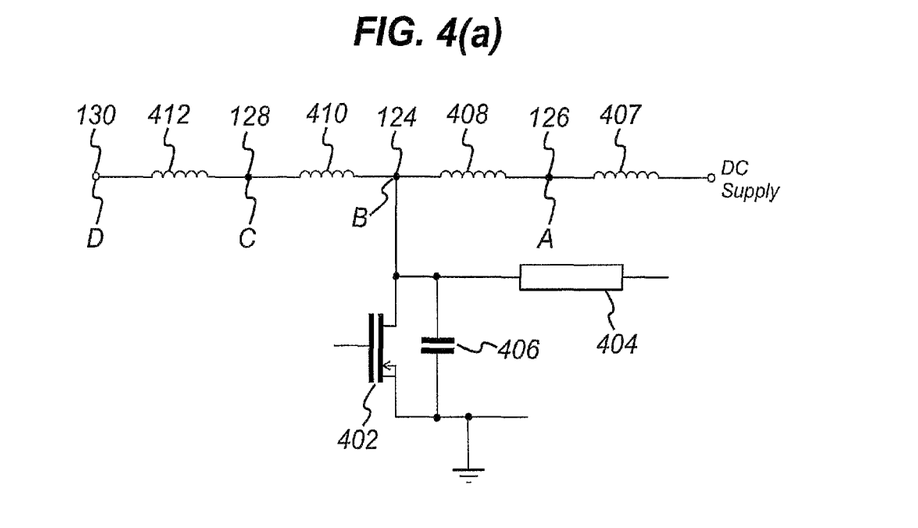
Figure 4B:
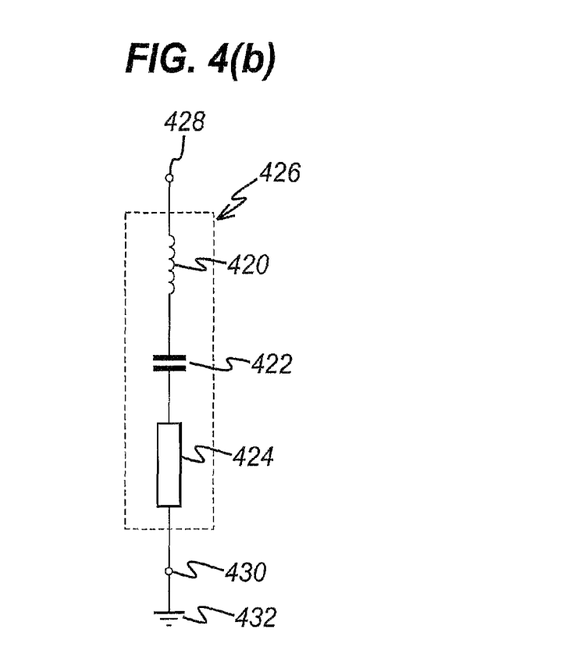

In various embodiments, the control circuit of the invention, as represented by the resonant circuit 426 of FIG. 4(b), may be connected at any one of the points A, B, C, D shown in FIGS. 1 and 4(a). Specifically, the terminal 428 may be connected to any one of the points A, B, C, D. These points represent the possible locations of the control circuit, or being locations of the output of the transistor power amplifier.

There are different advantages associated with the provision of the control circuit at ones of the various points. As can be seen from FIGS. 1 and 4(a), the closer the control circuit 426 is connected to the DC supply, the higher the value of the inductor 420 is required. A particularly advantageous location of the control circuit 426 is to connect the terminal 428 at point D, denoted by reference numeral 130 in FIG. 4(a). In such location, the series inductance provided by the inductors 407, 408, 410, 412 is such that the inductor 420 can be eliminated, and the control circuit 426 may comprise simply a capacitor 422 and a resistor 424. In such location of the control circuit, the inductors 407, 408, 410, 412 provide the inductance of the resonant circuit. Thus, it will be understood that whether the resonant circuit is required to specifically have an inductor component is dependent upon the size of the inherent inductance provided in the circuit implementation. The inductance of the control circuit may simply be provided by the inherent inductance within the circuit, and such inherent inductance becomes part of the circuit.

It should be noted that in FIG. 1 the points A, B, C, D are provided by way of example. As discussed hereinabove, point D has significant advantages insofar as that the inductance provided by the metallisation between the DC supply and point D is such that no specific inductor 420 may be required in a control circuit 426. It will also be understood that the points A, B, C, D are not the only points at which the control circuit may be applied. The control circuit may be applied at any point at the output stage. The points A, B, C, D are represented by reference numerals 126, 124, 128, 130 in FIG. 4(a). It will be understood that if any of these points move along the metallisation, either away from or toward the DC supply, then the inductance values of the inductors 407, 408, 410, 412 will vary. It should be noted that point B, denoted by reference numeral 124, represents the point at which the bond wire 112 connects with the metallisation layer 132 on the printed wiring or circuit board.

Figure 5:
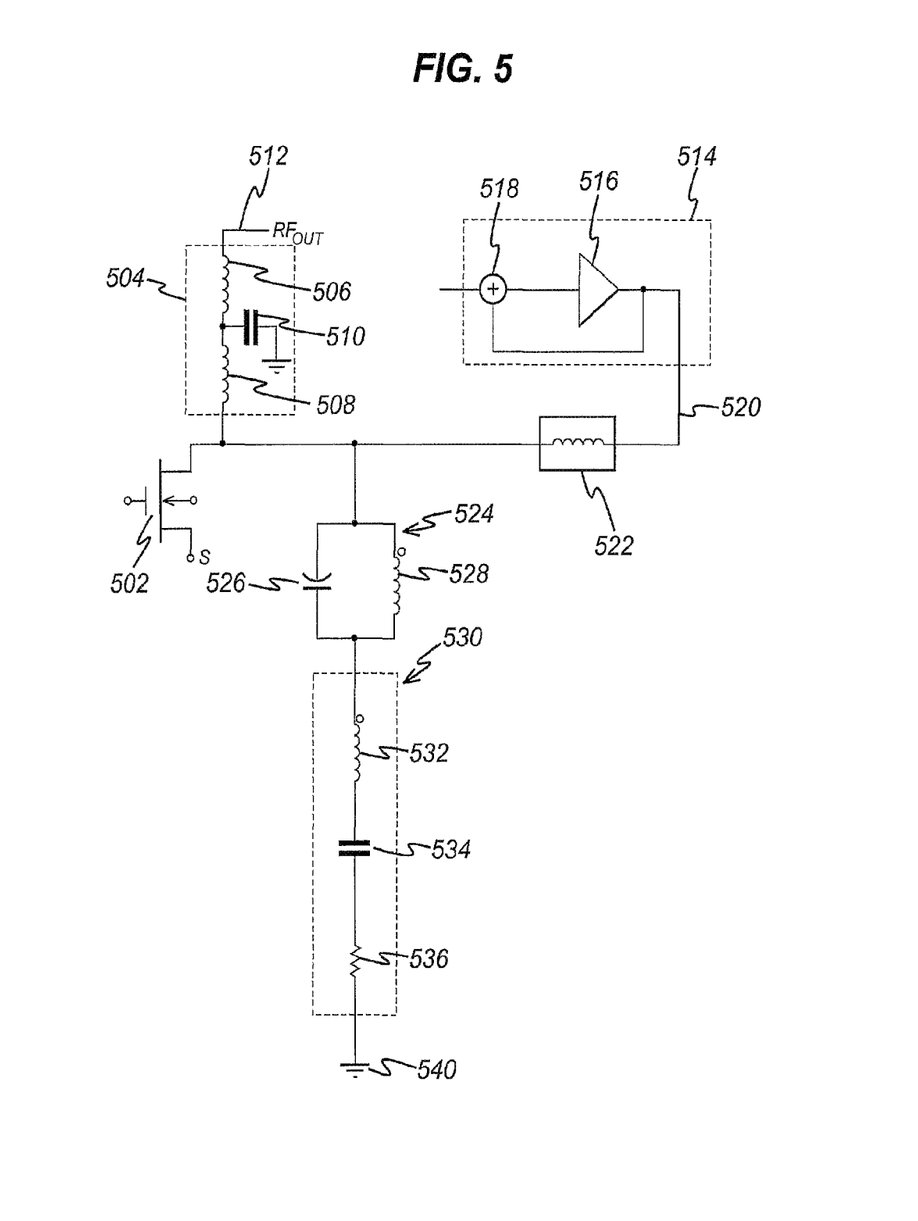
FIG. 5 illustrates the implementation of a particular embodiment of a control network in accordance with the invention in a power amplifier output network.

A further embodiment of the invention is illustrated in FIG. 5, which more fully illustrates an implementation of the output stage of a transistor power amplifier. In FIG. 5, the transistor power amplifier is denoted by reference numeral 502. Reference numeral 504 denotes a matching network connected to the output of the transistor through which the radio frequency output of the power amplifier is generated on line 512. The matching network comprises a series pair of inductors 508 and 506, and a parallel capacitor 510 connected to ground. The modulatable supply is denoted by reference numeral 514, and generally comprises an amplifier 516 having a feedback connection to a summer 518, which combines the output of the amplifier with an input signal. The modulatable DC supply is provided on line 520. An inductor 522 is connected between the output of the transistor power amplifier 502 and the modulatable power supply on line 520 represents the supply feed inductance.

In accordance with the invention, a control circuit 530 is provided comprising a resonant circuit and a resistive load.

The resonant circuit includes an inductor 532 and a capacitor 534, and a load 536 is provided. The control circuit 530 is connected to the output of the transistor power amplifier 502 via an RF blocking circuit 524, comprising an inductor 528 and a capacitor 526 connected in parallel.

The control circuit 530 is connected to ground as represented by 540.

Reference is made herein to high frequencies. The range of values of such high frequencies is application dependent. However in general reference to high frequencies is reference to high modulation frequencies. In a preferred implementation of the invention, in radio frequency applications, the range of high frequencies is at the upper part of the modulation spectrum, but substantially less than the frequency of the radio frequency signal.

Reference is also made herein to low impedance. The range of values of such low impedance is application dependent. In general, the impedance should not be substantially higher at any particular modulation frequency from the average impedance over a range of frequencies. In a preferred implementation, a low impedance is considered to be in the range of 1 to 10 ohms.

Thus, the invention and embodiments thereof provide a control circuit for use at the output of a power amplifier stage which utilises a modulated supply. The control circuit includes a resistor, and preferably a resonant circuit comprising an inductor and a capacitor. The inductor of the resonant circuit may be provided by inherent inductance contained in the output stage of the power amplifier. The provision of such a control circuit overcomes a problem associated with the power amplifier topology.

Embodiments of the invention have been described where the provision of the control circuit is "off-chip", and specifically connected to the metallisation of a printing wiring or circuit board. The invention is not limited to its implementation to such locations. For example, the control circuit may be implemented "on-chip". This gives direct access to the equivalent circuit such as shown in FIG. 2, and therefore may provide better performance. In FIG. 1, reference numerals 118 and 120 denote potential locations of the control circuit on-chip.

The specific values of the elements of the control circuit are implementation dependent. One skilled in the art will be able to choose appropriate values of the capacitor, inductor and resistor of the control circuit in accordance with the application in which it is being used.

In essence, the invention provides for maintaining a low impedance at the drain (output) node of the transistor in the power amplifier circuit such that parasitic resonance in the power amplifier circuit is damped.

The invention has been described herein by way of reference to particular embodiments and examples. The invention is not limited to any of the specific embodiments described. Modifications and variations to the embodiment presented herein will be understood by one skilled in the art. The scope of protection afforded by the invention is defined by the appended claims.

What is claimed is:

1. A circuit comprising:
   an amplifier;
   an envelope modulated power supply configured to provide a modulated power supply voltage to the amplifier;
   a first inductive element having a first terminal coupled to an output of the envelope modulated power supply and a second terminal coupled to an output of the amplifier via a node;
   a radio frequency (RF) matching network connected between the output of the amplifier and an output of the circuit;
   a resonant damping network including a resistive element, the resonant damping network connected to the node between the output of the amplifier and the second terminal of the first inductive element; and
   a reactive element connected in series with the resistive element, wherein the reactive element comprises a second inductive element in series with a capacitive element,
   wherein the resonant damping network further comprises another capacitive element in parallel with a third inductive element, wherein the other capacitive element is in series with the second inductive element.

2. The circuit of claim 1, in which the resonant damping network is connected directly at the output of the amplifier.

3. The circuit of claim 1, wherein the resonant damping network includes at least a capacitance of the amplifier and at least an inductance of a supply feed of the envelope modulated power supply.

4. The circuit according to claim 1, wherein the resistive element comprises a resistor.

5. The circuit according to claim 1, wherein the second inductive element comprises a conductive element of the circuit.

6. The circuit according to claim 5, wherein the conductive element of the circuit comprises a part of a conductive track or a bond wire.

7. The circuit according to claim 5, wherein the second inductive element comprises an inductor.

8. The circuit according to claim 1, wherein the other capacitive element comprises a capacitor.

9. The circuit according to claim 1, wherein the amplifier is for amplifying an RF signal.

10. The circuit according to claim 1, wherein one end of the resonant damping network is connected to the node and another end of the resonant damping network is connected to a reference potential.

11. A circuit comprising:
    an amplifier;
    an envelope modulated power supply configured to provide a power supply voltage to the amplifier;
    a first inductive element having a first terminal coupled to an output of the envelope modulated power supply and a second terminal coupled to an output of the amplifier via a node;
    a radio frequency (RF) matching network connected between the output of the amplifier and an output of the circuit, wherein the RF matching network comprises series inductors and a capacitor; and
    a resonant damping network including a resistive element, a capacitive element, and a second inductive element, the resonant damping network connected to the node between the output of the amplifier and the second terminal of the first inductive element, wherein the resonant damping network further comprises another capacitive element in parallel with a third inductive element, wherein the other capacitive element is in series with the second inductive element.

12. The circuit according to claim 11, wherein the RF matching network comprises a T-network.

13. The circuit according to claim 11, wherein one end of the resonant damping network is connected to the node and another end of the resonant damping network is connected to a reference potential for the circuit.

* * * * *